United States Patent [19]

Goleman et al.

[11] Patent Number: 5,303,113
[45] Date of Patent: Apr. 12, 1994

[54] DIGITAL CIRCUIT INTERRUPTER WITH RFI AND EMI SHIELDING

[75] Inventors: Ira B. Goleman, Waterbury; Mark S. DeBiasi, Windsor; Edward R. Bednarik, Farmington, all of Conn.

[73] Assignee: General Electric Company, New York, N.Y.

[21] Appl. No.: 860,627

[22] Filed: Mar. 30, 1992

[51] Int. Cl.⁵ .............................................. H02H 3/00
[52] U.S. Cl. ...................................... 361/93; 307/91; 220/306
[58] Field of Search ...................... 307/91, 89; 361/93; 222/306

[56] References Cited

U.S. PATENT DOCUMENTS

| | | | |
|---|---|---|---|
| 4,589,052 | 5/1986 | Dougherty | 361/94 |
| 4,602,164 | 7/1986 | Gore, III et al. | 307/91 |
| 4,672,501 | 6/1987 | Bilac et al. | 361/96 |
| 4,754,247 | 6/1988 | Raymont et al. | 335/202 |
| 4,759,466 | 7/1988 | Chase et al. | 220/306 |
| 4,814,566 | 3/1989 | Sigl | 200/305 |
| 4,870,531 | 9/1989 | Danek | 361/93 |
| 4,884,048 | 11/1989 | Castonguay et al. | 335/18 |
| 4,884,171 | 11/1989 | Maserang et al. | 361/424 |
| 4,945,443 | 7/1990 | DeBiasi et al. | 361/93 |
| 4,991,042 | 2/1991 | Tokarski et al. | 361/93 |
| 5,041,707 | 8/1991 | Anderson | 200/305 |
| 5,068,493 | 11/1991 | Benn, Sr. et al. | 174/35 |

Primary Examiner—Todd DeBoer
Attorney, Agent, or Firm—Richard A. Menelly

[57] ABSTRACT

A digital circuit interrupter containing radio frequency sensitive electronic equipment employs an electrically-insulative enclosure having a conductive coating on the exterior surface. The enclosure is inserted within the circuit interrupter enclosure during automated assembly of the circuit interrupter components.

9 Claims, 3 Drawing Sheets

DIGITAL CIRCUIT INTERRUPTER WITH RFI AND EMI SHIELDING

BACKGROUND OF THE INVENTION

This invention relates to so-called "smart" circuit interrupters employing digital electronic trip units. One such smart circuit interrupter is described within U.S. Pat. No. 4,589,052. Such digital trip units are capable of acting on a number of programmed setpoint trip parameters to interrupt the circuit being protected in a timely manner. One such digital trip unit which allows for user interaction and which provides capability both to select trip parameters and to view the selected trip parameters is found within U.S. Pat. No. 4,672,501.

For purposes of reducing cost while maintaining accuracy and functionality of the digital trip units, microprocessors are being employed to gather information, process the information, and provide a means of monitoring the information using associated digital circuitry. The use of such microprocessors allows more protection functions to be contained in smaller-sized enclosures.

U.S. Pat. No. 4,870,531 entitled "Circuit Breaker with Removable Display and Keypad" describes a user-interface unit that contains display capability for a multiplicity of circuit interrupter options by means of software located within the trip unit microprocessor while only displaying those parameters for which the digital trip unit is configured.

U.S. Pat. Nos. 4,945,443 and 4,991,042 both describe digital circuit interrupters employing user-accessible keypads and displays for both metering and circuit interruption. The intelligence contained within such "smart" circuit interrupters lies within the digital processor contained within the electronic trip circuit, usually housed within the circuit interrupter cover. However, such digital processors can be susceptible to powerful localized radio frequency interference signals hereafter "RFI" emanating from portable communication transmitters and telephones as well as localized electromagnetic interference hereafter "EMI" caused by high inductive switching circuits. RFI and EMI signals reaching the trip unit by parasitic transmission over the electric power distribution cables are readily filtered out from the trip unit circuit by conventional electronic filters. RFI and EMI signals that are transmitted to the trip unit circuit through the atmosphere can result in so-called "nuisance" tripping whereby the trip unit circuit becomes energized to a trip mode and, in turn, articulates the circuit breaker operating mechanism to interrupt circuit current during quiescent circuit current conditions. The shutdown of associated electrical equipment used within manufacturing facilities due to such nuisance tripping often results in unnecessary economic loss.

To delete such RFI and EMI signals from interfering with state-of-the-art electronic devices, a filter is generally interposed between the electronic devices and the possible sources of the RFI and EMI signals. U.S. Pat. No. 4,814,566 describes a pushbutton keyboard assembly employing EMI and RFI-shielded switch modules. U.S. Pat. No. 5,068,493 describes a gasket shielding for electronic equipment which contains embedded metal flakes. U.S. Pat. No. 4,884,171 teaches the use of EMI gaskets for shielding aircraft engine testers. U.S. Pat. No. 5,041,707 discloses a metallic cover plate used to provide EMI shielding to electric switches used on military aircraft.

One arrangement for protecting prior art digital circuit interrupting components from RFI and EMI signals comprises the application of electrically conductive paint directly onto the plastic housing that contains the sensitive electronic components during the circuit interrupter assembly. The direct application of conductive paint to the cover that houses the smart circuit interrupter components, however, is not feasible because of the risk of contacting the circuit interrupter components with the conductive paint. The extensive masking and venting techniques employed with the prior art digital circuit interrupter assembly processes are not feasible for the smart circuit interrupters due to the automated assembly of the digital electronic components as well as the compact arrangement of the electronic components within the circuit interrupter enclosure.

Accordingly, one purpose of this invention is to provide an inexpensive RFI and EMI filter that can be inserted within the smart circuit interrupter enclosure in an automated assembly process without requiring masking of the enclosure or venting of the environment surrounding the assembly equipment.

SUMMARY OF THE INVENTION

An RFI and EMI filter in the form of a rectangular enclosure closed at the bottom and sides is interposed between the smart circuit interrupter trip unit and the trip unit recess formed within the smart circuit interrupter housing. A coating of electrically conductive material is applied to the outer surface of the RFI and EMI filter to prevent the RFI and EMI signals from reaching the sensitive electronic components contained within the smart circuit interrupter trip unit assembly.

DESCRIPTION OF THE PREFERRED EMBODIMENT

Figure 1:
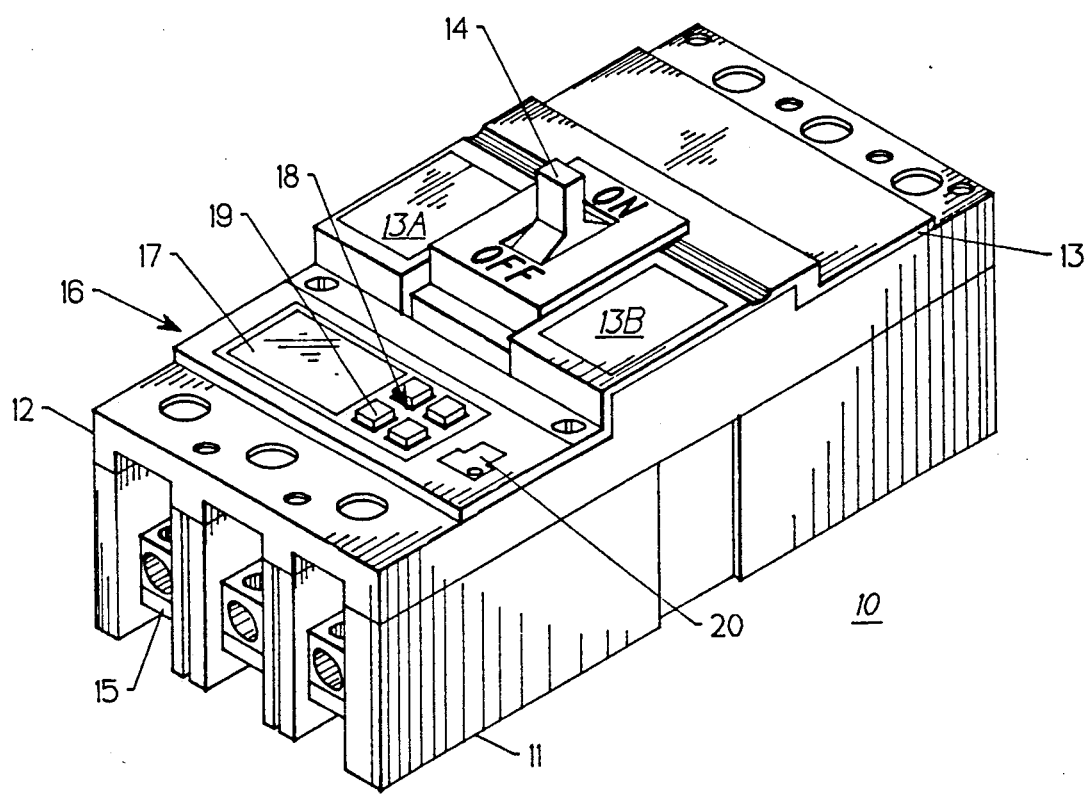
FIG. 1 is a top perspective view of a smart circuit interrupter employing the RFI and EMI filter in accordance with the invention.

A smart circuit interrupter 10 is shown in FIG. 1 and consists of an insulative case 11 to which an insulative cover 12 is securely fastened. As described in U.S. Pat. No. 4,754,247, an accessory cover 13 is attached to the circuit breaker cover and provides access to the circuit breaker accessories by means of a pair of accessory doors 13A, 13B. The circuit interrupter includes an operating mechanism as further described within the aforementioned U.S. Pat. No. 4,754,247 for interrupting circuit current upon the occurrence of an overcurrent condition and further includes an operating handle 14 for turning the circuit breaker between its ON and OFF conditions. Electrical connection is made with the associated electrical equipment by means of load lug connectors 15 arranged at the load end. As described in aforementioned U.S. Pat. No. 4,870,531, an electronic trip unit 16 which includes an external display 17 and keypad 18 is arranged on top of the electronic trip unit in modular assembly. The keys 19 allow an operator to access the memory elements contained within the trip unit for displaying the trip points as well as the circuit current and circuit voltage parameters. The rating plug 20 allows a single circuit interrupter size to be used over a wide range of circuit interrupter ampere ratings.

Figure 2:
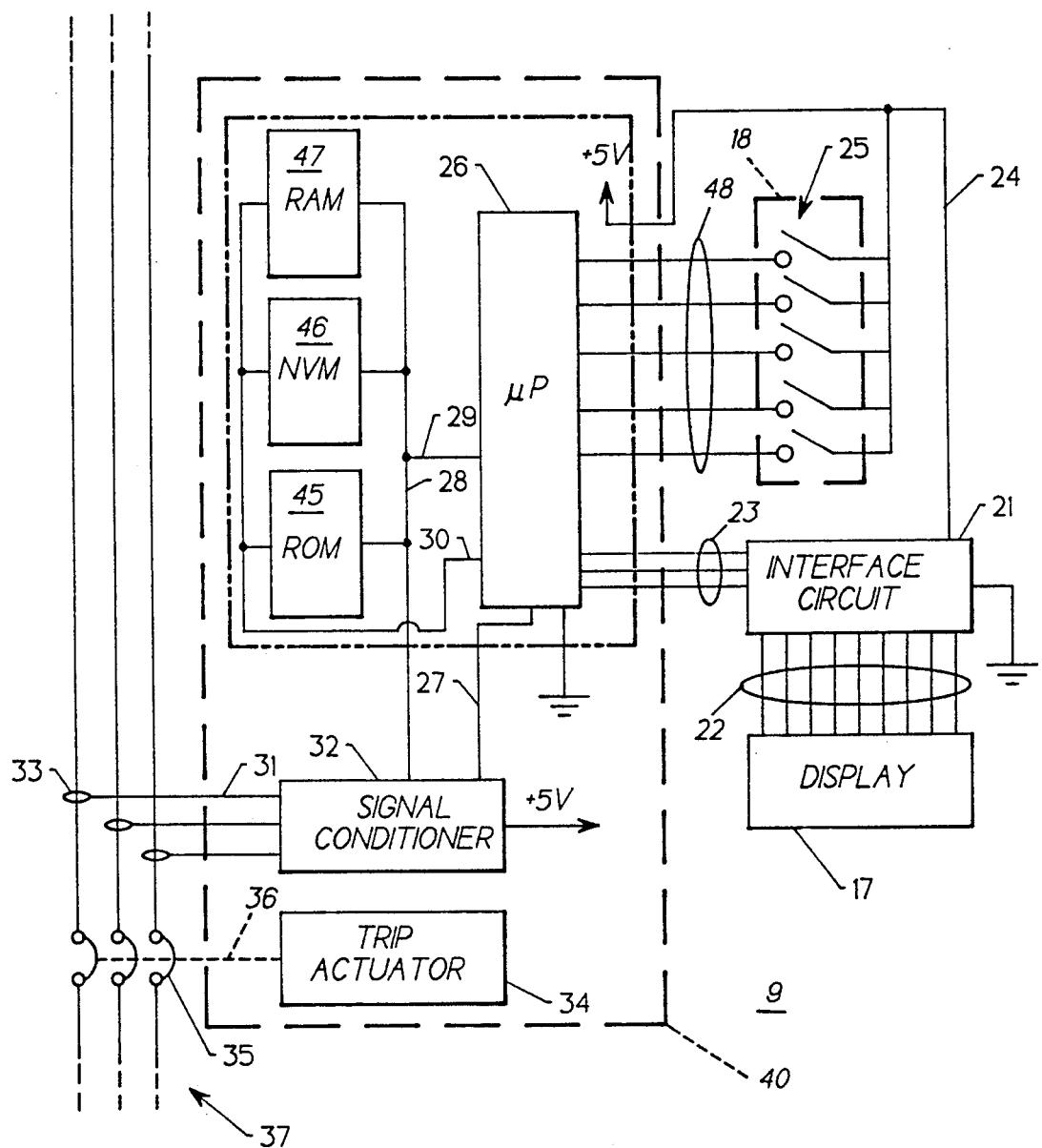
FIG. 2 is a schematic representation of the trip circuit employed within the smart circuit interrupter of FIG. 1.

The electronic trip circuit 9 within the electronic trip unit 16 is shown in FIG. 2 connected with the electrical power distribution cables 37 by means of current transformers 33 which provide input data to a signal conditioner circuit 32 over conductors 31. The circuit interrupter contacts 35 are electrically arranged within the electric distribution cables and are operably coupled as indicated at 36 with the circuit interrupter trip actuator unit 34. The input data from the signal conditioner circuit is connected with the microprocessor 26 by means of conductor 27 and with the ROM 45, NVM 46 and RAM 47 memory elements by means of an 8-bit databus 28. The microprocessor connects with the memory elements by means of the 12-bit databus 30 and connects with the 8-bit databus over a separate conductor 29 as indicated. The display unit 17 interconnects with the interface circuit 21 by means of the multi-conductor cable 22 and interfaces with the microprocessor 26 over a similar multi-conductor cable 23. The interface circuit operates in the manner described within the aforementioned U.S. Pat. No. 4,991,042 and connects with a voltage source over conductor 24. Voltage signal input is provided to the microprocessor 26 through the switches 25 contained within the keypad unit 18 over the multi-conductor cable 48.

Figure 3:
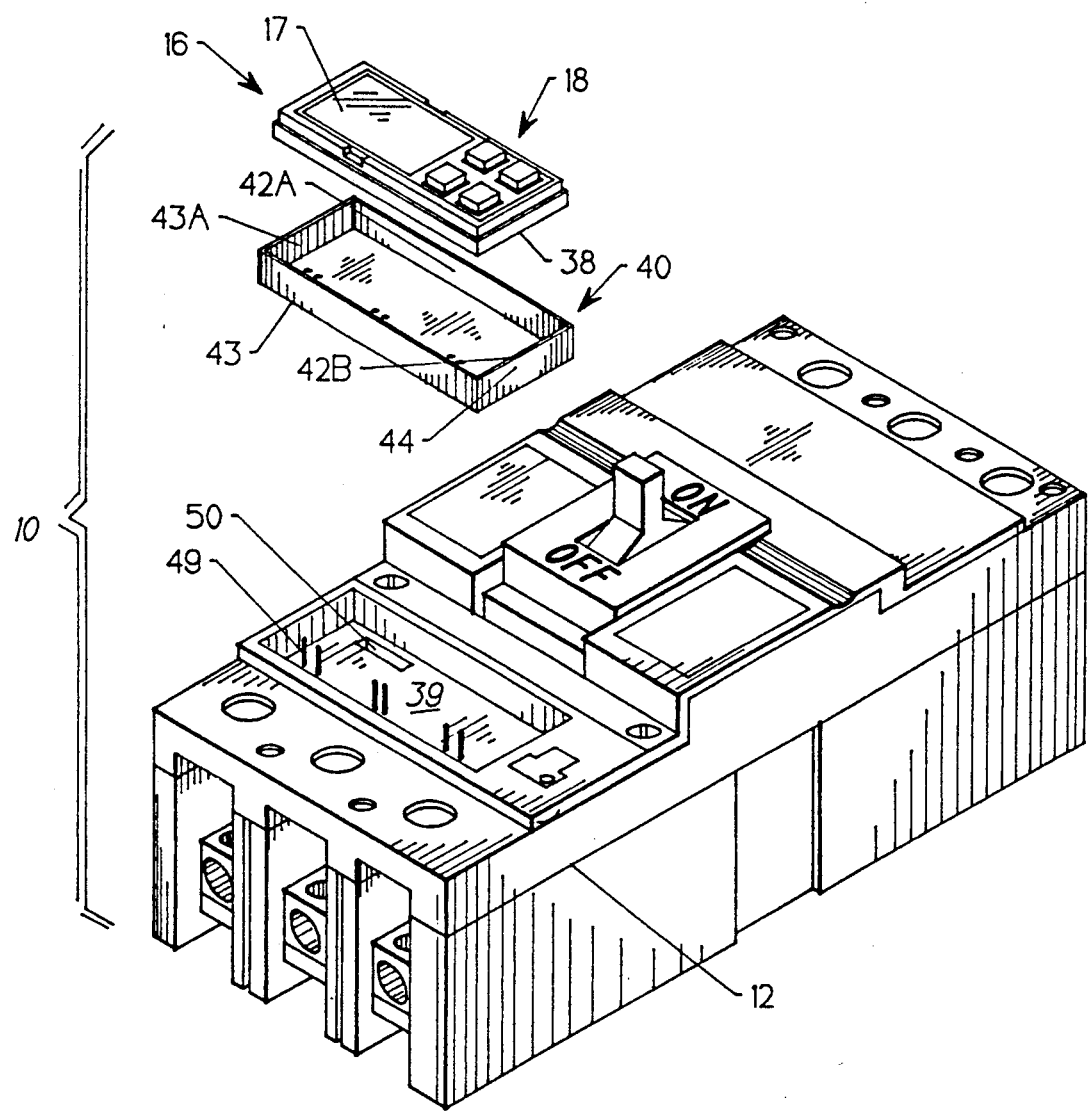
FIG. 3 is a top perspective view in isometric projection of the trip unit and RFI and EMI filter prior to insertion within the smart circuit interrupter of FIG. 1.

In accordance with the teachings of the invention, an RFI and EMI filter 40 (hereafter "filter") is arranged around the microprocessor 26, the ROM 45, and NVM 46 and RAM 47 memory elements to shield the sensitive memory elements and the microprocessor from extraneous RFI and EMI signals. The filter 40 is selectively positioned under the electronic trip unit 16 in the manner best seen by referring now to the circuit interrupter 10 depicted in FIG. 3. Prior to arranging the electronic trip unit 16 within the recess 39 (formed within the circuit interrupter cover 12), the filter 40 is first inserted within the recess. As described in U.S. Pat. No. 4,884,048, transformer pin connectors 49 extend up through the bottom of the recess 39 and a rectangular slot 50 is formed therein for providing electrical connection with electrical components contained within the circuit interrupter cover. The bottom 43 of the RFI filter 40 accordingly contains openings 43A to receive the transformer pin connectors within the circuit board 38. To effectively shield the sensitive electronic components contained within the printed circuit board 38, and without interfering with the visual access to the display 17 or digital access to the keypad 18, the RFI filter has the rectangular box-like configuration having opposing sidewalls 42A and endwalls 42B extending up from the bottom 43. Electrical conductivity is provided on the outside surface of the sidewalls and endwalls and on the outside bottom surface by the provision of a coating 44 that includes metal pigments such as silver, copper, nickel or aluminum. One example of an effective metallic coating is in the form of type 4900 silver conductive coating supplied from Chomerics Corporation. The shield is vacuum-formed from a thermoplastic material in an off-line operation and the metallic coating 44 is applied to the exterior surface of the sidewalls, endwalls and bottom. All openings are punch-formed after the coating 44 has been applied to ensure that no metal coating contacts the inside bottom 43 of the RFI and EMI filter or resides on the walls of the openings. This arrangement also ensures that none of the metal coating contacts the recess 39 which could cause electric circuit between the transformer pin connectors. The inner surfaces of the bottom 43 and the sidewalls 42A and endwalls 42B remain clear and uncoated to ensure additional electrical insulation to the electronic components contained within the printed circuit board 38. Besides providing excellent RFI and EMI shielding to the electronic trip unit, the filter 40 provides improved electrical isolation by virtue of the thermoplastic material. The heat generated within the trip unit is carried by the conductive coating 44 out to the sides of the circuit breaker cover in heat-sink fashion to provide cooling function to the trip unit during overload circuit conditions.

Having thus described our invention, what we claim and desire to secure by Letters Patent is:

1. An electronic circuit interrupter having RFI-EMI shielding comprising:
   a molded plastic circuit breaker cover and case secured together to form an enclosure for a circuit interrupter operating mechanism;
   a pair of contacts within said enclosure arranged for automatic separation upon actuation of said operating mechanism;
   an electronic trip unit within said enclosure interacting with said operating mechanism, said electronic trip unit articulating said operating mechanism upon occurrence of an overcurrent condition of predetermined magnitude and duration; and
   an RFI-EMI filter partially encompassing said electronic trip unit providing shielding to electronic components contains therein, said RFI-EMI filter comprising a self-contained insulative enclosure defining an interior bottom surface facing said electronic components, and an exterior bottom surface facing away from said components, said exterior bottom surface including electrically-conductive material.

2. The circuit interrupter of claim 1 wherein said enclosure shaped to said rectangular configuration.

3. The circuit interrupter of claim 2 wherein said plastic is vacuum-formed to said rectangular configuration.

4. The circuit interrupter of claim 1 wherein said electrically-conductive material comprises a metallic paint.

5. The circuit interrupter of claim 4 wherein said metallic paint is selected from the group consisting of aluminum, copper, nickel and silver.

6. An electronic circuit interrupter having RFI-EMI shielding comprising in combination:
   a molded plastic circuit interrupter case and cover;
   circuit interruption components contained within said circuit interrupter case;
   trip circuit components contained within said circuit interrupter cover interacting with said interruption components to interrupt circuit current upon occurrence of a circuit overload condition; and
   an RFI-EMI shield arranged within said circuit breaker cover under said trip circuit components, said RFI-EMI shield comprising a self-contained plastic enclosure containing an interior bottom surface, an exterior bottom surface, opposing sidewalls and opposing endwalls said exterior bottom surface including a coating of conductive metal, said endwalls and said sidewalls including a coating of conductive metal on exterior surfaces thereof.

7. The circuit interrupter of claim 6 wherein said plastic enclosure is vacuum-formed.

8. The circuit interrupter of claim 6 wherein said conductive metal is selected from the group consisting of aluminum, copper, nickel and silver.

9. The circuit interrupter of claim 6 wherein said conductive metal comprises metallic paint.

* * * * *